United States Patent
Gohary et al.

(10) Patent No.: US 9,467,212 B2
(45) Date of Patent: Oct. 11, 2016

(54) SYSTEM AND METHOD FOR MULTIPLE-INPUT MULTIPLE-OUTPUT COMMUNICATION

(71) Applicant: Huawei Technologies Canada Co., Ltd., Kanata (CA)

(72) Inventors: Ramy Gohary, Ottawa (CA); Halim Yanikomeroglu, Ottawa (CA)

(73) Assignee: Huawei Technologies Canada Co., Ltd., Kanata (CA)

( * ) Notice: Subject to any disclaimer, the term of this patent is extended or adjusted under 35 U.S.C. 154(b) by 0 days.

(21) Appl. No.: 14/706,591

(22) Filed: May 7, 2015

(65) Prior Publication Data

US 2015/0326284 A1    Nov. 12, 2015

Related U.S. Application Data

(60) Provisional application No. 61/991,399, filed on May 9, 2014.

(51) Int. Cl.
*H04L 27/00* (2006.01)
*H04B 7/04* (2006.01)
(Continued)

(52) U.S. Cl.
CPC .............. *H04B 7/0417* (2013.01); *H04B 7/04* (2013.01); *H04B 7/06* (2013.01); *H04B 7/0632* (2013.01);
(Continued)

(58) Field of Classification Search
CPC .............. H04L 27/2647; H04L 5/0007; H04L 25/03343; H04L 27/368; H04L 1/0618; H04L 1/0026; H04L 1/00; H04L 1/06; H04B 3/32; H04B 7/0417; H04B 7/0632; H04B 7/04; H04B 7/06; H03F 1/3247

USPC .......................................... 375/260, 285, 296
See application file for complete search history.

(56) References Cited

U.S. PATENT DOCUMENTS

| | | | |
|---|---|---|---|
| 6,016,328 A * | 1/2000 | Caire | H04L 7/027 329/300 |
| 2006/0161432 A1* | 7/2006 | Zhang | H04B 7/0417 704/238 |

(Continued)

FOREIGN PATENT DOCUMENTS

| | | |
|---|---|---|
| CN | 101207464 A | 6/2008 |
| CN | 101277172 A | 10/2008 |

(Continued)

OTHER PUBLICATIONS

Absil, et al., "Riemannian Geometry of Grassmann Manifolds with a View on Algorithmic Computation," http://www.cis.upenn.edu/~cis515/Diffgeom-Grassmann.Absil.pdf; Acta Applicandae Mathematicae, 80(2):199-220, Jan. 2004.

(Continued)

*Primary Examiner* — Sam K Ahn
*Assistant Examiner* — Janice Tieu
(74) *Attorney, Agent, or Firm* — Slater Matsil, LLP

(57) ABSTRACT

An embodiment communication system and method for using multiple-input multiple-output use. Kronecker model to determine a symbol coding formulation that achieves ergodic capacity for high signal-to-noise ratios (SNRs). The lower bound on this capacity is achieved by input signals in the form of the product of an isotropically distributed random Grassmannian component and a deterministic component comprising the eigenvectors and the inverse of the eigenvalues of the transmitter covariance matrix.

19 Claims, 1 Drawing Sheet

(51) Int. Cl.

| | | |
|---|---|---|
| *H04L 1/06* | (2006.01) | |
| *H04L 1/00* | (2006.01) | |
| *H04B 7/06* | (2006.01) | |
| *H04L 27/36* | (2006.01) | |
| *H04L 27/26* | (2006.01) | |
| *H04L 25/03* | (2006.01) | |
| *H03F 1/32* | (2006.01) | |
| *H04B 3/32* | (2006.01) | |
| *H04L 5/00* | (2006.01) | |

(52) U.S. Cl.
CPC ............... *H04L 1/00* (2013.01); *H04L 1/0026* (2013.01); *H04L 1/06* (2013.01); *H04L 1/0618* (2013.01); *H03F 1/3247* (2013.01); *H04B 3/32* (2013.01); *H04L 5/0007* (2013.01); *H04L 25/03343* (2013.01); *H04L 27/2647* (2013.01); *H04L 27/368* (2013.01)

(56) References Cited

U.S. PATENT DOCUMENTS

| | | | | |
|---|---|---|---|---|
| 2011/0019755 A1* | 1/2011 | Lee | ........................ | H04B 7/024 375/260 |
| 2011/0150113 A1* | 6/2011 | Oyman | ................. | H04L 1/0019 375/260 |
| 2013/0156075 A1* | 6/2013 | Shirani-Mehr | ....... | H04W 52/04 375/219 |

FOREIGN PATENT DOCUMENTS

| | | | |
|---|---|---|---|
| CN | 102075304 | A | 5/2011 |
| CN | 102130866 | A | 7/2011 |
| EP | 2627050 | A1 | 8/2013 |

OTHER PUBLICATIONS

Gohary, R.H., et al., "Non-Coherent MIMO Communication: Grassmannian Constellations and Efficient Detection," IEEE Transactions on Information Theory, vol. 55, No. 3, pp. 1176-1205, Mar. 2009.

Hiai, F., et al., "Asymptotic Freeness Almost Everywhere for Random Matrices," Acta. Sci. Math. (Szeged), vol. 66, pp. 809-834, 2000.

Hochwald, B.M., et al., "Unitary Space-Time Modulation Multiple-Antenna Communications in Rayleigh Flat Fading," IEEE Trans. Inf. Theory, vol. 46, pp. 543-564, Mar. 2000.

Jafar, S.A., et al., "Multiple-Antenna Capacity in Correlated Rayleigh Fading with Channel Covariance Information," IEEE Transactions on Wireless Communications, vol. 4, No. 3, pp. 990-997, May 2005.

Tulino, A.M., et al. "Random Matrix Theory and Wireless Communications," Found. Trend. Commun. Inf. Theory, vol. 1, No. 1, pp. 1-182, 2004.

Yu, K., et al., "Modeling of Wide-Band MIMO Radio Channels Based on NLoS Indoor Measurements," IEEE Transactions on Vehicular Technology, vol. 53, No. 3, pp. 655-665, May 2004.

Zheng, L., et al., "Communication on the Grassmann Manifold: A Geometric Approach to the Noncoherent Multiple-Antenna Channel," IEEE Trans. Inf. Theory, vol. 48, pp. 359-383, Feb. 2002.

Huawei, "Adaptive Feedback: A New Perspective of the Adaptive Codebook," 3GPP TSG RAN WG1 Meeting #58, R1-093059, Aug. 24-28, 2009, 5 pages.

International Search Report, Application No. PCT/CN2015/078505, mailed Aug. 7, 2015, 11 pages.

* cited by examiner

SYSTEM AND METHOD FOR MULTIPLE-INPUT MULTIPLE-OUTPUT COMMUNICATION

This application claims the benefit of U.S. Provisional Application No. 61/991,399, filed on May 9, 2014, entitled "The Ergodic High SNR Capacity of the Kronecker Spatially-Correlated Non-Coherent MIMO Channel Within an SNR-Independent Gap," which application is hereby incorporated herein by reference.

TECHNICAL FIELD

The present invention relates to a system and method for wireless communication and in particular embodiments relates to a system and method for multiple-input multiple-output communication.

BACKGROUND

Multiple-input multiple-output (MIMO) communication systems provide a spectrally-efficient means for communicating over wireless channels. Such systems can be classified into coherent systems in which the receiver has access to reliable channel state information (CSI) and non-coherent systems in which this information is not available at either the transmitter or the receiver. Coherent systems are more straightforward to design than their non-coherent counterparts. However, the analysis of coherent systems usually does not account for the cost of the resources that have to be expended to acquire reliable CSI. Ignoring this cost in static and slow fading scenarios is generally tolerable. Ignoring it in fast fading scenarios, which arise in wireless systems with high mobility, can be rather misleading. A mobile device that is traveling at 60 miles per hour has a fading coherence of about 3 ms. If the mobile system is operated at 1.9 GHz and has a symbol rate of 30K symbols per second, 3 ms allows for 50-100 symbol periods. If several training symbols per antenna are needed, only a few antennas may be trained during a fading coherence period.

In order to alleviate the cost of acquiring reliable CSI in fast fading scenarios, it is often believed to be desirable to use non-coherent signaling strategies, that is, strategies that do not require the receiver to have access to CSI. It has been shown that, for spatially-white MIMO channels with independent identically distributed (i.i.d.) block Rayleigh fading coefficients, input matrices that achieve the ergodic capacity can be expressed in the form of an isotropically distributed unitary component and a diagonal component with non-negative entries (Hochwald and Marzetta, "Unitary space-time modulation multiple-antenna communications in Rayleigh flat fading," IEEE Trans. Inf. Theory, vol. 46, pp. 543-564, March 2000, which is hereby incorporated herein in its entirety by reference). A closed form expression for the asymptotically high signal-to-noise ratio (SNR) ergodic capacity of this type of channel has been determined for the cases where the coherence time of the channel exceeds and is below a certain threshold. When the coherence time of the channel exceeds the threshold, it was shown that, for sufficiently high SNRs, it is optimal, from a capacity perspective, for the diagonal component to be a scaled identity matrix and for the unitary matrix to be isotropically distributed on the so-called Grassmann manifold and to have the number of antennas transmitting less than or equal to half the number of symbol durations spanned by the coherence interval of the channel. Various techniques for designing rate-efficient Grassmannian constellations have been shown (L. Zheng and D. N. C. Tse, "Communication on the Grassmann manifold: A geometric approach to the noncoherent multiple-antenna channel," IEEE Trans. Inf. Theory, vol. 48, pp. 359-383, February 2002, which is hereby incorporated herein in its entirety by reference). For the case where the SNR is below the threshold, the unitary component was shown to have the same distribution as when above the threshold, but the optimal distribution for the diagonal component was shown to be that of the square root of the eigenvalues of a beta-distributed random matrix. In contrast with the high SNR cases, for low SNRs, it has been shown that the optimal diagonal component has at most one non-zero entry at any given time.

The proximity of antennas to each other in practical wireless systems renders the realization of spatially-white channels generally difficult, even when the distance between antennas exceeds multiple wavelengths. This proximity induces correlation between the random entries of the channel matrix at the transmitter and receiver sides. A convenient means for characterizing this correlation mathematically is the so-called Kronecker model, whereby the spatially-correlated channel matrix is represented by left and right multiplication of a spatially-white channel matrix with transmitter and receiver covariance matrices, respectively. Fortunately, these matrices are dominated by the locations, geometries and beam patterns of the antennas at the receiver and the transmitter. Being characteristic of the wireless devices on which the antennas are mounted, these matrices can be accurately estimated and made available to the transmitter and the receiver. The impact of these matrices on the proper signaling methodology and the achievable rate can be quite significant. For the case in which the correlation between the channel coefficients is described by the Kronecker model, it has been shown that for spatially white channels, increasing the number of transmit antennas is almost surely beneficial. It has also been shown that the optimal input covariance can be expressed as the product of an isotropically distributed unitary component, a diagonal component with non-negative entries and a deterministic component comprising the eigenvectors of the transmitter covariance matrix.

SUMMARY

An embodiment of the disclosure is a communication system including a plurality of antennas. A precoder is included to combine data to be transmitted with a coding matrix to form transmission symbols. The coding matrix is formed by combining a Grassmannian matrix comprising a distribution on a Grassmannian manifold with a function of a transmitter covariance matrix. A transmitter is connected to the plurality of antennas and is configured to transmit the transmission symbols.

The coding matrix may be formed according to the formula $$X = Q_X D U_A^\dagger$$

where, $Q_X$ is an isotropically distributed unitary matrix; D is a random diagonal matrix with non-negative entries; and $U_A$ is a matrix containing the eigenvectors of the transmitter covariance matrix, in this case the † indicates that it is the conjugate transpose of that matrix. The random diagonal matrix may be determined according to the formula $$D = \sqrt{\frac{TP}{Tr\Lambda_A^{-1}}} \Lambda_A^{-1/2}$$

where, T is the coherence time, P is the transmit power, Tr is the trace function; and $\Lambda_A$ is a matrix composed of the eigenvalues of the transmitter covariance matrix.

Another embodiment is a communication system including a base station with a plurality of antennas configured to transmit to a plurality of mobile receivers. The base station includes a precoder that combines data to be transmitted with a coding matrix to produce transmission symbols. The coding matrix is formed by combining a Grassmannian matrix comprising a distribution on a Grassmannian manifold with a function of a transmitter covariance matrix. A transmitter connected to the plurality of antennas and configured to transmit the transmission symbols.

The coding matrix may be formed according to the formula $$X = Q_X D U_A^\dagger$$

where, $Q_X$ is an isotropically distributed unitary matrix; D is a random diagonal matrix with non-negative entries; and $U_A$ is a matrix containing the eigenvectors of the transmitter covariance matrix, in this case the † indicates that it is the conjugate transpose of that matrix. The random diagonal matrix may be determined according to the formula $$D = \sqrt{\frac{TP}{Tr\Lambda_A^{-1}}} \Lambda_A^{-1/2}$$

where, T is the coherence time, P is the transmit power, Tr is the trace function; and $\Lambda_A$ is the eigenvalues of the transmitter covariance matrix.

Another embodiment is a communication method including combining data to be transmitted wirelessly using a plurality of antennas with a coding matrix formed by combining a Grassmannian matrix comprising a distribution on a Grassmannian manifold with a transmitter covariance matrix to produce transmission symbols, and then transmitting the transmission symbols.

The coding matrix may be formed according to the formula $$X = Q_X D U_A^\dagger$$

where, $Q_X$ is an isotropically distributed unitary matrix; D is a random diagonal matrix with non-negative entries; and $U_A$ is a matrix containing the eigenvectors of the transmitter covariance matrix, in this case the † indicates that it is the conjugate transpose of that matrix. The random diagonal matrix may be determined according to the formula $$D = \sqrt{\frac{TP}{Tr\Lambda_A^{-1}}} \Lambda_A^{-1/2}$$

where, T is the coherence time, P is the transmit power, Tr is the trace function; and $\Lambda_A$ is the eigenvalues of the transmitter covariance matrix.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The structure, manufacture and use of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
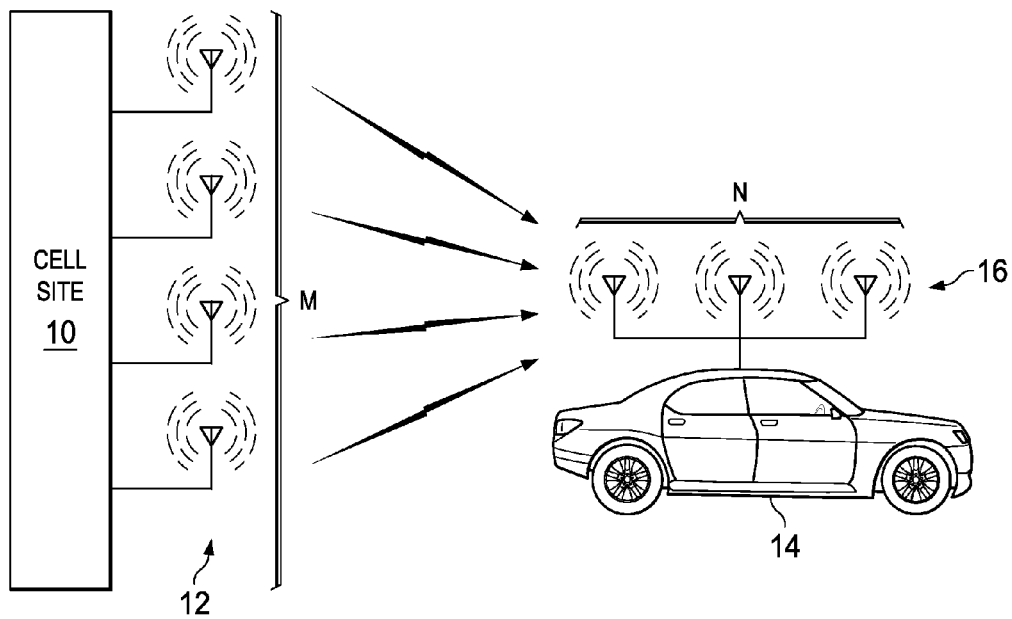
FIG. 1 is a diagram illustrating an example MIMO communications system.

FIG. 1 is a diagram of a basic MIMO system. Access point (AP) 10 is a base station including multiple antennas. As one example, cell site 10 may be configured as a NodeB in a UMTS cellular communication system. Cell site 10 has M antennas 12. A particular transmission channel will use more than one of antennas 12 to take advantage of the MIMO transmission system. In the described embodiment, mobile station 14 will also include N antennas 16. The following description discusses transmissions from cell site 10 to mobile station 14. However, the principles of this embodiment are equally applicable to transmissions from mobile station 14 to cell site 10, provided that mobile site 14 includes adequate processing capabilities to implement this embodiment. It should also be noted that the receiver of the MIMO transmission can also be a stationary receiver, and need not be a mobile station.

In the following discussion, random and deterministic matrices will be denoted by boldface and regular face upper case letters, respectively. The m×m identity matrix will be denoted by $I_m$, and the standard O(●) notation will be used to imply that $g_1(x) = O(g_2(x))$ if $g_1(x)/g_2(x) \to a$ as $x \to \infty$, a is a constant.

A frequency-flat block Rayleigh fading channel in which the signals emitted from the transmit antennas are correlated and the signals impinging on the receiver antennas are also correlated can be used as a preliminary model. This situation arises in practice when the antenna elements are not sufficiently spaced for their signals to be statistically independent. Denoting the number of transmit and receive antennas by M and N, respectively, the channel matrix can be expressed as $H = XA^{1/2}H_wB^{1/2}$, where $A \in C^{M \times M}$ and $B \in C^{N \times N}$ are the Hermitian positive semi-definite transmit and receive covariance matrices, respectively, and $H_w \in C^{M \times N}$ is a random matrix with zero-mean unit-variance i.i.d. circularly-symmetric complex Gaussian entries. To avoid degenerate scenarios, it can be assumed that both A and B are full rank, and other cases will be alluded to as necessary.

In the block fading model, the channel assumes a statistically independent realization over each block of T channel uses and remains essentially constant within each block. This model is realistic in perfectly interleaved frequency-hopping systems and is useful in characterizing high mobility scenarios in current Long Term Evolution (LTE) cellular systems in which time-frequency resource blocks are assigned to each user during a coherence interval. In this case, the received signal matrix can be expressed as $$Y = XA^{1/2}H_wB^{1/2} + V \qquad (1)$$

where $X \in C^{T \times M}$ represented the transmitted signal matrix, and $Y \in C^{T \times N}$ represents the additive noise matrix; the entries of V are i.i.d. zero mean unit variance circularly-symmetric complex Gaussian random variables. The matrices A and B are normalized so that Tr(A)=Tr(B)=1, and, assuming that the power budget of the transmitter P, there is the following power constraint:

$$E\{Tr(XX^\dagger)\} \le TP \quad (2)$$

The matrices A and B can be estimated from the physical properties of the propagation environment and the antenna pattern, and can hence be assumed to be known. The communication scenario that is considered is non-coherent, thereby the matrix $H_w$ in (1) is not known to either the transmitter or the receiver.

Conditioned on X=X, the matrix Y in (1) is Gaussian distributed with $$vec(Y) = (B^{1/2} \otimes XA^{1/2})vec(H_w) + vec(V) \quad (2.5)$$

where vec(●) is the operator that stacks the columns of the matrix argument on top of each other. Now the covariance matrix $$E\{vec(Y)vec^\dagger(Y)|X\} = B \otimes XAX^\dagger + I_{NT} \quad (3)$$

Hence, conditioned on X=X, the probability density function (PDF) of Y can be expressed as $$p(Y \mid X = X) = \frac{\exp(-vec^\dagger(Y)(B \otimes XAX^\dagger + I_{NT})^{-1} vec(Y))}{\pi^{TN} \det(B \otimes XAX^\dagger + I_{NT})} \quad (4)$$

Using this expression it is straightforward to verify that for any deterministic T×T unitary matrix Φ, p(ΦY|ΦX=ΦX). This along with Lemma 1 in Hochwald et al. (B. M. Hochwald and T. L. Marzetta, "Unitary space-time modulation multiple-antenna communications in Rayleigh flat fading," IEEE Trans. Inf. Theory, vol. 46, pp. 543-564, March 2000, which is hereby incorporated herein in its entirety by reference) can be combined to show that the structure of the matrix X that achieves the ergodic non-coherent capacity of the channel in (1) can be expressed as $$X = Q_X D U_A^\dagger \quad (5)$$

Where $Q_X$ is an isotropically distributed unitary matrix fulfilling the model of a Grassmannian manifold (See Absil et al. Riemannian Geometry of Grassmann Manifolds with a View on Algorithmic Computation. Acta Applicandae Mathematicae, 80(2):199-220, 2004, http://www.cis.upenn.edu/~cis515/Diffgeom-Gras smann.Absil.pdf, which is hereby incorporated herein in its entirety by reference), D is a random diagonal matrix with non-negative entries and $U_A$ is the matrix containing the eigenvectors of A, i.e. $A = U_A \Lambda_A U_A^\dagger$.

Figure 2:
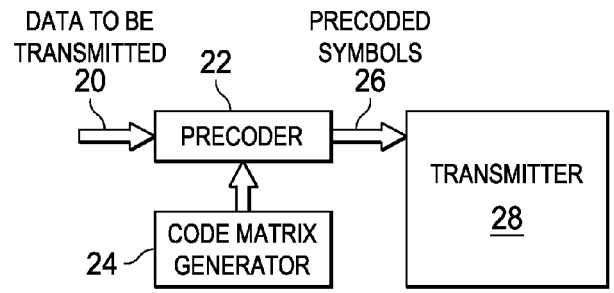
FIG. 2 is a block diagram of an implementation of a described embodiment.

An implementation of equation (5) can be used in an embodiment to provide ergodic capacity (or near ergodic capacity) in a non-coherent transmission system. FIG. 2 is a block diagram of one such embodiment. The data to be transmitted 20 is provided to a precoder 22. A code book based on X from equation (5) is generated in code matrix generator 24. These codes are provided to precoder 22, which combines the appropriate codes from the code matrix to generate precoded symbols 26. Specific examples of precoding for several transmission standards are described in Kuo et al., Precoding Techniques for Digital Communication Systems (Springer Science+Business Media 2008), which is hereby incorporated herein in its entirety by reference. Those skilled in the art will appreciate that the precoder can combine matrices using any number of techniques including matrix multiplication, which may be constrained with objectives including the maintenance of orthogonality.

Figure 3:
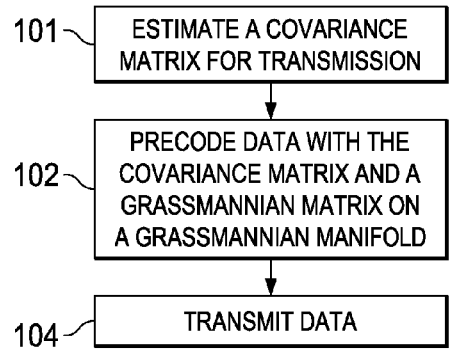
FIG. 3 is a flow chart of an embodiment of the disclosure.

These precoded symbols are used by transmitter 28, which combines them with codes according to the transmission system being used (IS-95 also conventionally referred to as Code Division Multiple Access (CDMA), LTE, or other transmission standard) to prepare symbols for transmission. The transmitter then uses antenna 12 to transmit the symbols wirelessly to mobile unit 16. FIG. 3 is a flow diagram of the operation of the embodiment of FIG. 2. In step 101, a covariance matrix is determined for the transmitter. In step 102, the data to be transmitted is precoded with the covariance matrix and a Grassmannian matrix on a Grassmannian manifold as described herein. In step 104, the precoded data is transmitted.

In the current discussion, result of Equation (5) is used as a basis upon which an asymptotically tight expression for the ergodic high SNR non-coherent capacity of the channel model in (1), i.e. the capacity as P goes to infinity, is derived.

For a given power budget P in (2), let C(P) denote the ergodic non-coherent capacity of the channel in (1). It can then be written:

$$C(P) = \max_{p(X),\, E\{Tr(XX^\dagger)\} \le TP} \frac{1}{T}(h(Y) - h(Y \mid X)) \quad (6)$$

C(P) can be evaluated as P goes to infinity.
Evaluating h(Y|X)

To evaluate the second term in (6) equation (3) can be used along with the fact that, condition on X, Y, is Gaussian distributed to write:

$$h(Y \mid X) = NT \log \pi e + E\{\log \det(B \otimes XAX^\dagger + I_{NT})\} \quad (7)$$
$$= NT \log \pi e + \Sigma_{i=1}^M \Sigma_{j=1}^N E\{\log(\lambda_{B_j} \lambda_{A_i} d_i^2 + 1)\}$$

where in writing (7) invokes (5) and the eigen properties of the Kronecker product and used $\lambda_{A_i}$ and $\lambda_{B_j}$ denote the i-th and j-th eigenvalues of A and B, respectively, and $d_i$ to denote the i-th entry of D.

As the transmit power goes to infinity, it can be seen that (7) can be expressed as $$h(Y \mid X) = NT \log \pi e + \sum_{i=1}^M \sum_{j=1}^N E\{\log(\lambda_{B_j} \lambda_{A_i} d_i^2)\} + O(1/P) \quad (8)$$
$$= NT \log \pi e + N \log \det A + M \log \det B + NE\{\log \det D^2\} + O(1/P)$$

This approximation is valid when D is full rank and its entries scale with P. This condition will be shown to hold for the matrix D to achieve the lower bound on the high SNR ergodic capacity derived below when the number of transmit antennas is less than or equal to the number of receive antennas, i.e., M≤N and the transmit power, P, is sufficiently large. For simplicity, the remainder of this discussion will focus on the case of M=N.

Asymptotic Bound on h(Y)

A high SNR approximation of the first term in (6) is now used. Additionally, because the focus is on the case of M=N, the results in section IIIB of Zheng et al. (L. Zheng and D. N. C. Tse, "Communication on the Grassmann manifold: A geometric approach to the noncoherent multiple-antenna channel," IEEE Trans. Inf. Theory, vol. 48, pp. 359-383, February 2002, which is hereby incorporated herein in its entirety by reference) are also used.

As P goes to infinity, the differential entropy, h(Y), is dominated by the differential entropy of $XA^{1/2}H_wB^{1/2}$. In particular, using the results in [11] produces $$h(Y)=h(XA^{1/2}H_wB^{1/2})+O(1/P) \quad (8.5)$$

Expressing the matrix A in terms of its eigen decomposition, and noting that $H_w$ is isotropically distributed, it can be written that $H_w \stackrel{d}{=} U_A{}^t H_w$ where "$\stackrel{d}{=}$" denotes equality in distribution. Using this fact and invoking (5) yields $$h(XA^{1/2}H_wB^{1/2})=h(Q_XD\Lambda_A{}^{1/2}H_wB^{1/2})=h((B^{1/2}\otimes I_T)\,\text{vec}(Q_XD\Lambda_A{}^{1/2}H_w)) \quad (8.75)$$

Using corollary 9.6.4 from Cover et al. (T. M. Cover and J. A., Thomas, *Elements of Information Theory*, New York: Wiley, 1991, which is hereby incorporated herein in its entirety by reference), allows $$h((B^{1/2}\otimes I_T)\text{vec}(Q_XD\Lambda_A{}^{1/2}H_w))=h(Q_XD\Lambda_A{}^{1/2}H_w)+T\log\det B \quad (9)$$

To evaluate $h(Q_XD\Lambda_A{}^{1/2}H_w)$ one can follow the methodology in Zheng et al. for the case of M=N to express this entropy in the coordinate system corresponding to the QR-decomposition. (As used herein, the QR decomposition (also called a QR factorization) is a linear algebra operation that is a decomposition of a matrix A into a product A=QR of an orthogonal matrix Q and an upper triangular matrix R.) In particular, the matrix $Q_XD\Lambda_A{}^{1/2}H_w$ can be expressed as $Q_XR$, where R is a random upper triangular matrix. Since $Q_X$ is isotropically distributed, the matrix $Q_XD\Lambda_A{}^{1/2}H_w \stackrel{\text{def}}{=} Q_X\Psi D\Lambda_A{}^{1/2}H_w$ where $\Psi$ is an isotropically distributed M×M unitary matrix. Now, the matrix $\Psi D\Lambda_A{}^{1/2}H_w$ can be expressed as $\Psi R$. Note that if the matrix $D\Lambda_A{}^{1/2}$ is full rank, then so $D\Lambda_A{}^{1/2}H_w$. It will later be shown that this assumption holds and use the QR decompositions to write $$h(Q_XD\Lambda_A{}^{1/2}H_w)=h(Q_X)+h(R)+E\{\log J_1\} \quad (10)$$

where $J_1$ is the Jacobian of the transformation from Cartesian to QR coordinates and is given by Zheng et al., $J_1=\prod_{i=1}^M R_{ii}^{2(T-i)+1}$. Similarly, $$h(\Psi D\Lambda_A{}^{1/2}H_w)=h(\Psi)+h(R)+E\{\log J_2\} \quad (11)$$

where $J=\prod_{i=1}^M R_{ii}^{2(M-i)+i}$.

Substituting for h(R) from (11) into (10) yields:

$$h(Q_XD\Lambda_A^{\frac{1}{2}}H_w) = h(\Psi D\Lambda_A^{\frac{1}{2}}H_w) + h(Q_X) - h(\Psi) + E\{\log J_1/J_2\} \quad (12)$$
$$= h(\Psi D\Lambda_A^{\frac{1}{2}}H_w) + \log|\mathbb{G}_M(\mathbb{C}^T)| + (T-M)$$
$$E\{\log\det H_w^\dagger D^2\Lambda_A H_w\}$$

where in writing the second equality the fact that $Q_X$ and $\Psi$ are isotropically distributed is used, whence $h(Q_X)-h(\Psi)$ is equal to the logarithm of the volume of the Grassmann manifold, $$|\mathbb{G}_M(\mathbb{C}^T)| = \frac{\prod_{i=t-M+1}^T 2\pi^i(i-1)!}{\prod_{i=1}^T 2\pi^i(i-1)!} \quad (12.5)$$

To obtain an upper bound on $h(\Psi D\Lambda_A{}^{1/2}H_w)$, it is noted that the covariance $$E\{(I_M\otimes\Psi D\Lambda_A{}^{1/2})\text{vec}(H_w)\text{vec}^\dagger(H_w)(I_M\otimes\Lambda_A{}^{1/2}D\Psi h u\,\dagger)\}=I_M\otimes E\{\Psi D^2\Lambda_A\Psi^\dagger\} \quad (13)$$

To compute the last expectation the following result is used from Hiai et al. (F. Hiai and D. Petz, "Asymptotic freeness almost everywhere for random matrices," Acta. Sci. Math. (Szeged), vol. 66, pp. 809-834, 2000) and Tulino et al. (A. M. Tulino and S. Verd'u, "Random matrix theory and wireless communications," Found. Trend. Commun. Inf. Theory, vol. 1, no. 1, pp. 1-182, 2004, which is hereby incorporated herein in its entirety by reference).

Lemma 1:

For any isotropically distributed unitary matrix $$\Phi \in \mathbb{C}^{n\times m}, E\{|\Phi|_{ij}^*|\Phi|_{kl}\} = \frac{1}{n}\delta_{ik}\delta_{jl},$$

where $\delta_{ik}$ is the Kronecker delta.

Using this result yields, $$E\{\Psi D^2\Lambda_A\Psi^\dagger\} = \frac{1}{M}Tr(E\{D^2\}\Lambda_A)I_M \quad (13.5)$$

Whence an upper bound on $h(\Psi D\Lambda_A{}^{1/2}H_w)$ can be readily obtained by applying Theorem 9.6.5 in Cover et al., which yields:

$$h(\Psi D\Lambda_A^{1/2}H_w) \le \log\det\frac{\pi e}{M}Tr(E\{D^2\}\Lambda_A)I_{M^2} \quad (14)$$

$$= M^2\log\frac{\pi e}{M}Tr(E\{D^2\}\Lambda_A) \quad (15)$$

and equality holds if and only if $\Psi D\Lambda_A{}^{1/2}H_w$ is Gaussian and distributed with covariance $$\frac{1}{M}Tr(E\{D^2\}\Lambda_A)I_{M^2}.$$

In other words, equality holds if and only if the entries of the matrix are $\Psi D\Lambda_A{}^{1/2}H_w$ i.i.d. zero mean Gaussian random variables with variance $$\frac{1}{M}Tr(E\{D^2\}\Lambda_A).$$

Upper and Lower Bounds on Capacity

Upper Bound:

To obtain an upper bound on capacity, (2) is used to bound the right hand side of (15). In particular, let $\lambda_{A_1}\ge\ldots\ge\lambda_{A_M}>0$, which yields, $$h(\Psi D\Lambda_A^{1/2}H_w) \le M^2\log\frac{\pi eT}{M}\lambda_{A_1}P \quad (16)$$

Notice that this bound is not achievable unless A and $E\{D^2\}$ are scaled identities.

Using (16) with (12) and (9) yields $$h(Y) \leq M^2 \log \frac{\pi e T}{M} \lambda_{A_1} P + \log|\mathbb{G}_M(\mathbb{C}^T)| + \qquad (16.5)$$
$$(T-M)E\{\log \det H_w^\dagger D^2 \Lambda_A H_w\} + T \log \det B$$

Using this bound with (8) and the fact that M=N, yields $$C(P) \leq M\left(\frac{M}{T} - 1\right)\log \pi e + \frac{M^2}{T}\log\frac{TP}{M} + \qquad (17)$$
$$\frac{M}{T}\sum_{i=2}^{M}\log\frac{\lambda_{A_1}}{\lambda_{A_i}} + \left(1 - 2\frac{M}{T}\right)E\{\log \det D^2\} + \frac{1}{T}\log|\mathbb{G}_M(\mathbb{C}^T)| +$$
$$\left(1 - \frac{M}{T}\right)E\{\log \det \Lambda_A H_w H_w^\dagger\} + \left(1 - \frac{M}{T}\right)\log \det B + O(1/P)$$

When T≥2M, C(P) can be further bounded by using Jensen's inequality and the fact that log det(●) is a concave function. Doing so, yields E{log detD²}≤log det E{D²}, with equality if and only if D is deterministic. Subject to the power constraint in (2), the upper bound of this inequality can be further bounded by $$M\log\frac{TP}{M}.$$

Hence, $$C(P) \leq M\left(1 - \frac{M}{T}\right)\log\frac{TP}{\pi e M} + \frac{M}{T}\sum_{i=2}^{M}\log\frac{\lambda_{A_1}}{\lambda_{A_i}} + \frac{1}{T}\log|\mathbb{G}_M(\mathbb{C}^T)| + \qquad (18)$$
$$\left(1 - \frac{M}{T}\right)\log AB + \left(1 - \frac{M}{T}\right)E\{\log \det H_w H_w^\dagger\} + O(1/P)$$

Lower Bound:

To obtain a lower bound on capacity, recalling that, for an arbitrary distribution of D, the right hand side of (14) is achievable if and only if the entries of the matrix $\Psi D \Lambda_A^{1/2} H_w$ are i.i.d. Gaussian distributed. This condition is satisfied if the matrix D is deterministic and given by $$D = \sqrt{\frac{TP}{Tr\Lambda_A^{-1}}} \Lambda_A^{-1/2},$$

c.f. (2). Substituting this value of D in (15) yields $$h(\Psi D \Lambda_A^{1/2} H_w) = M^2 \log\frac{\pi e TP}{Tr\Lambda_A^{-1}}$$

Thereby, at setting of D, yields $$h(Y) = M^2\log \pi e + \log|\mathbb{G}_M(\mathbb{C}^T)| +$$
$$(T-M)E\{\log \det H_w H_w^\dagger\} + MT\log\frac{TP}{Tr\Lambda_A^{-1}} + T\log \det B + O(1/P)$$

and $$h(Y|X) = MT\log \pi + M\log \det B + M^2 \log\frac{TP}{Tr\Lambda_A^{-1}} + O(1/P)$$

Since this setting of D is not necessarily optimal, it can be written $$C(P) \geq M\left(1 - \frac{M}{T}\right)\log\frac{TP}{\pi e Tr\Lambda_A^{-1}} + \frac{1}{T}\log|\mathbb{G}_M(\mathbb{C}^T)| + \qquad (19)$$
$$\left(1 - \frac{M}{T}\right)\log \det B + \left(1 - \frac{M}{T}\right)E\{\log \det H_w H_w^\dagger\} + O(1/P)$$

Bounds on Gap to Capacity

Comparing (18) to (19), it can be seen that setting $$D = \sqrt{\frac{TP}{Tr\Lambda_A^{-1}}} \Lambda_A^{-1/2}$$

yields a gap to capacity of:

$$\Delta = (T - 2M)\log \det A + M^2\log\lambda_{A_1} + M(T-M)\log\frac{TrA^{-1}}{M}$$

It should be noted that when $$A = \frac{1}{M}I_M,$$

Δ=0. Otherwise Δ is strictly greater than zero, and an upper bound on it can be derived as follows. Let κ be the condition number of A; i.e. $\kappa = \lambda_{A_1}/\lambda_{A_M}$. Hence, $$\Delta = \qquad (20)$$
$$\left(1 - 2\frac{M}{T}\right)\log\Pi_{i=1}^{M}\frac{\lambda_{A_i}}{\lambda_{A_1}} + M\left(1 - \frac{M}{T}\right)\log\Sigma_{i=1}^{M}\frac{\lambda_{A_1}}{\lambda_{A_i}} - M\left(1 - \frac{M}{T}\right)\log M$$

To obtain a bound on Δ, note that, because $\lambda_{A_i} \geq \ldots \geq \lambda_{A_M} > 0$, the first term in (20) is non-positive, and the argument of the logarithm in the second term is bounded by $M_\kappa$. Using these observations, results in $$\Delta \leq M\left(1 - \frac{M}{T}\right)\log \kappa \qquad (21)$$

Hence, it has been shown that the upper and lower bounds obtained on capacity are within a gap proportional to the logarithm of the condition number of the transmitter covariance matrix, and that that gap does not depend on the SNR or the receiver covariance matrix.

Theorem 1

For the communication scenario described in (1) and (2), when T≥2M and M=N, the ergodic high SNR capacity C(P) satisfies:

$$\log\frac{TP}{\pi e Tr\Lambda_A^{-1}} \le \frac{C(P)-c}{M(1-M/T)} \le \log\frac{TP\kappa}{\pi e Tr\Lambda_A^{-1}} \quad (22.5)$$

where $$c = \frac{1}{T}\log|G_M(C^T)| + \left(1-\frac{M}{T}\right)\log\det B + \left(1-\frac{M}{T}\right)E\{\log\det H_w H_w^t\} + O(1/P).$$

Furthermore, the lower bound on C(P) is achieved by input signal matrices of the from in (5) with $$D = \sqrt{\frac{TP}{Tr\Lambda_A^{-1}}}\Lambda_A^{-1/2}.$$

Effect of Transmitter Covariance Condition Number on Achievable Rate

The rate on the right hand side of (19) is achievable using the strategy outlined in Theorem 1. That theorem shows that this rate is within $$M\left(1-\frac{M}{T}\right)\log\kappa$$

of the channel capacity. To investigate the effect of increasing κ on this rate, derive upper and lower bounds on that rate and it will shown that both bounds decrease with κ, indicating that high correlation at the transmitter can be deleterious to the achievable rate if the signaling strategy of Theorem 1 were to be used.

The transmitter covariance affects the right hand side of (19) through log $Tr\Lambda_A^{-1}$. Hence, upper and lower bounds on the achievable rate can be derived by obtaining lower and upper bounds on log $Tr\Lambda_A^{-1}$, respectively.

Lemma 2

Any positive definite matrix A, satisfies $$\log(M-1+\kappa) \le \log Tr\Lambda_A^{-1} \le \log\left(2(M-1)+\frac{1}{\kappa}+(M-1)^2\kappa\right) \quad (22)$$

Proof: To prove the first inequality, write:

$$\log Tr\Lambda_A^{-1} = \log\left(\frac{1}{\lambda_{A_M}}\left(\frac{\lambda_{A_M}}{\lambda_{A_1}}+\ldots+\frac{\lambda_{A_M}}{\lambda_{A_{M1}}}+1\right)\right)$$
$$\ge \log\left(\kappa\left(\frac{1}{\kappa}+\ldots+\frac{1}{\kappa}+1\right)\right)$$
$$= \log(M-1+\kappa)$$

To prove the second inequality write $$\log Tr\Lambda_A^{-1} = \log\left(\frac{1}{\lambda_{A_1}}\left(1+\frac{\lambda_{A_1}}{\lambda_{A_2}}+\ldots+\frac{\lambda_{A_1}}{\lambda_{A_M}}+1\right)\right) \le$$
$$\log\left(\frac{\lambda_{A_1}+\ldots+\lambda_{A_M}}{\lambda_{A_1}}(1+(M-1)\kappa)\right) \le \log\left(2(M-1)+\frac{1}{\kappa}+(M-1)^2\kappa\right)$$

This inequality holds with equality when M=2 and with strict inequality when M>2 and the eigenvalues of A are distinct.

It can be verified that both inequalities are monotonically increasing in κ. Hence, using the result of this lemma in the right hand side of (19), it can be seen that both the lower and upper bounds on the rates achievable by the strategy outlined in Theorem 1 are monotonically decreasing with the condition number of the transmitter covariance matrix, which indicates that the more ill-conditioned this matrix is, the less the rate that can be achieved with this strategy. This result has an intuitive explanation. The signaling strategy in Theorem 1 allocates more power to the weak eigenmodes of the channel. Hence, when the channel matrix is ill-conditioned, most of the power is allocated to that mode, thereby affecting the power available for transmission over the strong eigenmodes of the channel.

In the above discussion the high-SNR ergodic capacity of spatially-correlated MIMO channels was discussed. Closed form expressions for a lower and an upper bound on this capacity were obtained and it was shown that difference between these bounds is monotonically decreasing in the condition number of the transmitter covariance matrix. In particular, an expression for the high-SNR ergodic capacity of the considered channel that is tight with a constant that depends solely on the signaling dimension and the condition number of the transmitter covariance matrix is obtained.

The foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. A communication node comprising:
   a multiple input multiple output (MIMO) antenna array;
   a precoder configured to precode a set of Grassmannian-structured symbols according to a transmit covariance matrix associated with the MIMO antenna array to produce a set of Grassmannian-structured precoded symbols; and
   a transmitter coupled in-between the MIMO antenna array and the precoder, the transmitter configured to transmit the set of Grassmannian-structured precoded symbols over a spatially correlated non-coherent channel between the MIMO antenna array and a receiver.

2. The communication node as in claim 1 wherein the set of Grassmannian-structured symbols are generated by precoding input signals with a Grassmannian matrix having a Grassmannian manifold, wherein the distribution of the Grassmannian matrix on the Grassmannian manifold is an isotropic distribution.

3. The communication node of claim 1 wherein the set of Grassmannian-structured symbols are precoded in accordance with the square root of the inverse of the eigenvalues of the transmit covariance matrix.

4. The communication node of claim 1 wherein the transmitter communicates with a mobile receiver configured to receive the set of Grassmannian-structured precoded symbols.

5. The communication node of claim 1 where a coding matrix X of the set of Grassmannian-structured precoded symbols is $$X = Q_X D U_A^\dagger$$

Where $Q_X$ is a unitary matrix isotropically distributed on a Grassmannian manifold, D is a random diagonal matrix with non-negative entries, and $U_A$ is a matrix containing eigenvectors of the transmit covariance matrix.

6. The communication node of claim 5 where the random diagonal matrix is determined according to $$D = \sqrt{\frac{TP}{Tr\Lambda_A^{-1}}} \Lambda_A^{-1/2}$$

Where T is a coherence time, P is a transmit power, Tr is a trace function, and $\Lambda_A$ is a matrix of eigenvalues of the transmit covariance matrix.

7. A communication node as in claim 1 wherein the communication node is a base station.

8. A communication method comprising:
precoding, by a precoding device, symbols to be transmitted wirelessly using a plurality of antennas by precoding a set of Grassmannian-structured symbols according to a transmit covariance matrix associated with a multiple input multiple output (MIMO) antenna array to produce a set of Grassmannian-structured precoded symbols; and
transmitting, by a transmitter device, the set of Grassmannian-structured precoded symbols over a spatially correlated non-coherent channel between the MIMO antenna array and a receiver.

9. The communication method as in claim 8 wherein the set of Grassmannian-structured symbols are generated by precoding input signals with a Grassmannian matrix having a Grassmannian manifold, wherein the distribution of the Grassmannian matrix on the Grassmannian manifold is an isotropic distribution.

10. The communication method of claim 8 wherein the set of Grassmannian-structured precoded symbols are precoded in accordance with the square root of the inverse of the eigenvalues and the eigen vectors of the transmit covariance matrix.

11. The communication method of claim 8 wherein the set of Grassmannian-structured precoded symbols are transmitted to a mobile receiver.

12. The communication method of claim 8 where a coding matrix X of the set of Grassmannian-structured precoded symbols is $$X = Q_X D U_A^\dagger$$

where $Q_X$ is a unitary matrix isotropically distributed on a Grassmannian manifold, D is a random diagonal matrix with non-negative entries, and $U_A$ is a matrix containing eigenvectors of the transmit covariance matrix.

13. The communication method of claim 12 where the random diagonal matrix is determined according to $$D = \sqrt{\frac{TP}{Tr\Lambda_A^{-1}}} \Lambda_A^{-1/2}$$

where T is a coherence time, P is a transmit power, Tr is a trace function, and $\Lambda_A$ is a matrix of eigenvalues of the transmit covariance matrix.

14. A computer program product comprising:
a non-transitory computer readable storage medium storing programming, the programming including instructions to:
precode symbols to be transmitted wirelessly using a plurality of antennas by precoding a set of Grassmannian-structured symbols according to a transmit covariance matrix associated with a multiple input multiple output (MIMO) antenna array to produce a set of Grassmannian-structured precoded symbols; and
transmit the set of Grassmannian-structured precoded symbols over a spatially correlated non-coherent channel between the MIMO antenna array and a receiver.

15. The computer program product of claim 14 wherein the set of Grassmannian-structured symbols are generated by precoding input signals with a Grassmannian matrix having a Grassmannian manifold, wherein the distribution of the Grassmannian matrix on the Grassmannian manifold is an isotropic distribution.

16. The computer program product of claim 14 wherein the set of Grassmannian-structured precoded symbols are precoded in accordance with the square root of the inverse of the eigenvalues of the transmit covariance matrix.

17. The computer program product of claim 14 wherein the transmitter communicates with a mobile receiver configured to receive the set of Grassmannian-structured precoded symbols.

18. The computer program product of claim 14 where a coding matrix X of the set of Grassmannian-structured precoded symbols is $$X = Q_X D U_A^\dagger$$

where $Q_X$ is a unitary matrix isotropically distributed on a Grassmannian manifold, D is a random diagonal matrix with non-negative entries, and $U_A$ is a matrix containing eigenvectors of the transmit covariance matrix.

19. The computer program product of claim 18 where the random diagonal matrix is determined according to $$D = \sqrt{\frac{TP}{Tr\Lambda_A^{-1}}} \Lambda_A^{-1/2}$$

where T is a coherence time, P is a transmit power, Tr is a trace function, and $\Lambda_A$ is a matrix of eigenvalues of the transmit covariance matrix.

* * * * *

UNITED STATES PATENT AND TRADEMARK OFFICE
CERTIFICATE OF CORRECTION

PATENT NO. : 9,467,212 B2  
APPLICATION NO. : 14/706591  
DATED : October 11, 2016  
INVENTOR(S) : Ramy Gohary et al.

Page 1 of 1

It is certified that error appears in the above-identified patent and that said Letters Patent is hereby corrected as shown below:

In the Claims

In Col. 13, line 46, claim 10, delete "and the eigen vectors".

Signed and Sealed this
Sixth Day of December, 2016

Michelle K. Lee
*Director of the United States Patent and Trademark Office*